United States Patent [19]

Kazama

[11] Patent Number: 5,394,099
[45] Date of Patent: Feb. 28, 1995

[54] ELECTROCONDUCTIVE CONTACT PROBE WITH INTERMEDIATELY SUPPORTED, SPRING URGED CONVERGING NEEDLES HAVING PARALLEL FREE ENDS

[75] Inventor: Toshio Kazama, Nagano, Japan

[73] Assignee: NHK Spring Co., Ltd., Japan

[21] Appl. No.: 13,465

[22] Filed: Feb. 4, 1993

[30] Foreign Application Priority Data

Feb. 4, 1992 [JP] Japan .................................. 4-047833

[51] Int. Cl.$^6$ ............................................ G01R 1/00
[52] U.S. Cl. .................................................. 324/754
[58] Field of Search ............... 324/158 F, 158 P, 72.5, 324/754, 755; 439/482, 524

[56] References Cited

U.S. PATENT DOCUMENTS

| | | | |
|---|---|---|---|
| 4,423,376 | 12/1983 | Byrnes et al. | 324/158 P |
| 4,535,536 | 8/1985 | Wyss | 324/158 P |
| 4,544,888 | 10/1985 | Kvaternik | 324/158 P |
| 4,633,176 | 12/1986 | Reiner | 324/158 P |
| 4,686,467 | 8/1987 | DeLapp et al. | 324/158 F |
| 4,896,107 | 1/1990 | Maelzer et al. | 324/158 P |
| 5,003,255 | 3/1991 | Kazama | 324/72.5 |
| 5,004,977 | 4/1991 | Kazama | 324/72.5 |

*Primary Examiner*—Vinh Nguyen
*Attorney, Agent, or Firm*—Skjerven, Morrill, MacPherson, Franklin & Friel

[57] ABSTRACT

A contact probe unit includes a plurality of contact probes secured to a receptacle holder plate member, and a free end guide plate member provided with a plurality of guide holes for slidably receiving the needle members, at a density higher than that of the contact probes at the receptacle holder plate member, and at least one intermediate guide plate member disposed between the free end guide plate member and the receptacle holder plate member so as to allow an axial movement to the needle members and provide a lateral support to the needle members. Thereby, each of the needle members can be favorably guided for axial movement between the receptacle holder plate member and the free end guide plate member so as to eliminate the possibility of two adjacent needle member touching each other in the region between the receptacle holder plate member and the free end guide plate member, and improve the durability of the needle members. Further, the process of fabrication can be simplified because the efforts required for passing each needle member through the corresponding guide hole of the free end guide plate member are substantially reduced by the provision of the intermediate guide plate member.

5 Claims, 4 Drawing Sheets prior art

ELECTROCONDUCTIVE CONTACT PROBE WITH INTERMEDIATELY SUPPORTED, SPRING URGED CONVERGING NEEDLES HAVING PARALLEL FREE ENDS

TECHNICAL FIELD

The present invention relates to a contact probe unit for simultaneously accessing a plurality of points, and in particular to a contact probe unit for accessing a plurality of points by using a plurality of electroconductive needle members for assessing the electric states of conductive patterns formed on a printed circuit board and signals associated with electronic devices.

BACKGROUND OF THE INVENTION

The conventional electroconductive contact probe used for electrically testing conductive patterns of printed circuit boards and electronic devices normally comprises an electroconductive needle member, a tubular receptacle slidably receiving the needle member, and a spring member biasing the needle member out of the receptacle from its free end so that the free end of the needle member may be elastically pushed against an object to be tested. Such electroconductive contact probes are disclosed in U.S. Pat. Nos. 5,003,255 and 5,004,977 both issued to Kazama Mar. 2, 1991 and Apr. 2, 1991, respectively, and copending patent applications Ser. Nos. 07/737,763 and 07/739,051 both filed Jul. 30, 1991. The contents of these patents and patent applications are incorporated in the present application by reference.

In a contact probe unit incorporating a multiplicity of such contact probes for simultaneously accessing a multiplicity of points, the receptacles of the individual contact probes are secured to an electrically insulating receptacle holder in a mutually parallel relationship. With the demand for an increasingly higher wiring density in the recent printed circuit board design, 1% has become increasingly important to arrange the individual contact probes as close to each other as possible in the receptacle holder.

FIG. 4 illustrates a conventional contact probe unit for accessing a multiplicity of points in which the free ends of the individual contact probes are arranged in a highly dense distribution. Each individual contact probe 22 is passed through an electrically insulating receptacle holder 21 and fixedly secured thereto. An electrically conductive needle member 23 is slidably received in each of the receptacles 22. A compression coil spring not shown in the drawing is received in each of the receptacles 22 for urging the needle member out of the free end (the lower end as seen in FIG. 4) of the receptacle 22.

The contact probe unit further includes a free end guide plate member 25 which is secured to the receptacle holder 21 in a mutually parallel relationship by support posts 24. The free end guide plate member 25 is provided with a multiplicity of guide holes 25a each receiving the free end of the needle member 23 of the corresponding contact probe in a freely slidably manner. The density of the distribution of the guide holes 25a in the free end guide plate member 25 is higher than the density of the contact probes 22 in the receptacle holder 21. The base end of each of the needle members 23 received in the rear end of the corresponding receptacle 22 is connected to a control unit not shown in the drawing by way of a lead wire 26. Thus, the contact probe unit can simultaneously access a multiplicity of points of a highly densely arranged electroconductive pattern 27a of a printed circuit board 27 even when the density of the points to be accessed is higher than the highest possible density with which the contact probes may be mounted on the receptacle holder of the contact probe unit.

However, according to such a conventional contact probe unit, since the needle members 23 are not assisted by any member in the space between the receptacle holder 21 and the free end guide plate member 25, it is highly difficult to pass the individual needle members through the corresponding guide holes of the free end guide plate member 25 during the process of fabricating or repairing each contact probe unit. In particular, when the contact probes ere arranged in a two dimensional layout, the efforts required for the assembly work and the maintenance work are significant.

Further, each of the needle members 23 is subjected to a substantial axial compressive stress when it is pushed against a point to be tested by overcoming the spring force, there is a tendency to buckle in the part of the needle member 23 situated between the receptacle holder 21 and the free end guide plate member 25 as indicated by the imaginary lines in FIG. 4. If such a buckling of the needle members is excessively, the adjacent needle members 23 may touch each other. An additional problem is the difficulty in achieving a uniformity of the axial positions of the free ends of the needle members 23.

BRIEF SUMMARY OF THE INVENTION

In view of such problems of the prior art, a primary object of the present invention is to provide an improved contact probe unit which can access a multiplicity of densely distributed points in a highly reliable fashion even when the density of the points to be accessed is substantially greater than the highest possible density with which the receptacles of the individual contact probes can be mounted on the receptacle holder.

A second object of the present invention is to provide a contact probe unit capable of accessing a multiplicity of densely distributed points and provided with means for preventing the buckling of the needle members of the individual contact probes.

A third object of the present invention is to provide a contact probe unit capable of accessing a multiplicity of densely distributed points which is easy and economical to manufacture.

These and other objects of the present invention can be accomplished by providing a contact probe unit, comprising: a receptacle holder member; a plurality of contact probes secured to the receptacle holder member in mutually substantially parallel relationship, each of the contact probes comprising a tubular receptacle having a free end and a base end, a needle member slidably received in the receptacle, and spring means urging the needle member so as to project a free end of the needle member from the free end of the receptacle; a free end guide member secured to the receptacle holder member in a spaced relationship relative to the receptacle holder member, and provided with a plurality of guide holes for slidably receiving the needle members, the density of the guide holes of the free end guide member being higher than the density with which the contact probes are secured to the receptacle holder member; and an intermediate guide means disposed between the free end guide member and the receptacle holder member so as to allow an axial movement to the needle members and provide a lateral support to the needle members.

Thus, the part of each of the needle members situated between the receptacle holder member and the free end guide member receives a lateral support from the intermediate guide means while being allowed to undergo free axial movement, and is therefore positively prevented from buckling. As a result, the curvature of each of the needle members is favorably controlled, and is made lees prone to wear and fatigue.

According to a preferred embodiment of the present invention, the intermediate guide means comprises a plurality of guide plate members layered between the free end guide member and the receptacle holder member substantially without any gap therebetween and each provided with a plurality of guide holes each receiving an intermediate part of a corresponding one of the needle members, the density of the guide holes of the intermediate guide plate members being progressively increased from the guide plate member adjacent the receptacle holder member to the guide plate member adjacent the free end guide member so that the needle members may be guided for axial movement without involving excessive curvature.

Thereby, not only each of the needle members can be favorably guided for axial movement between the receptacle holder member and the free end guide member but also the process of fabrication can be simplified because the efforts required for passing each needle member through the corresponding guide hole of the free end guide member are substantially reduced by the provision of the intermediate guide means.

By thus controlling the bending deformation of the needle members, it is possible to eliminate the possibility of two adjacent needle members touching each other in the region between the receptacle holder member and the free end guide member.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
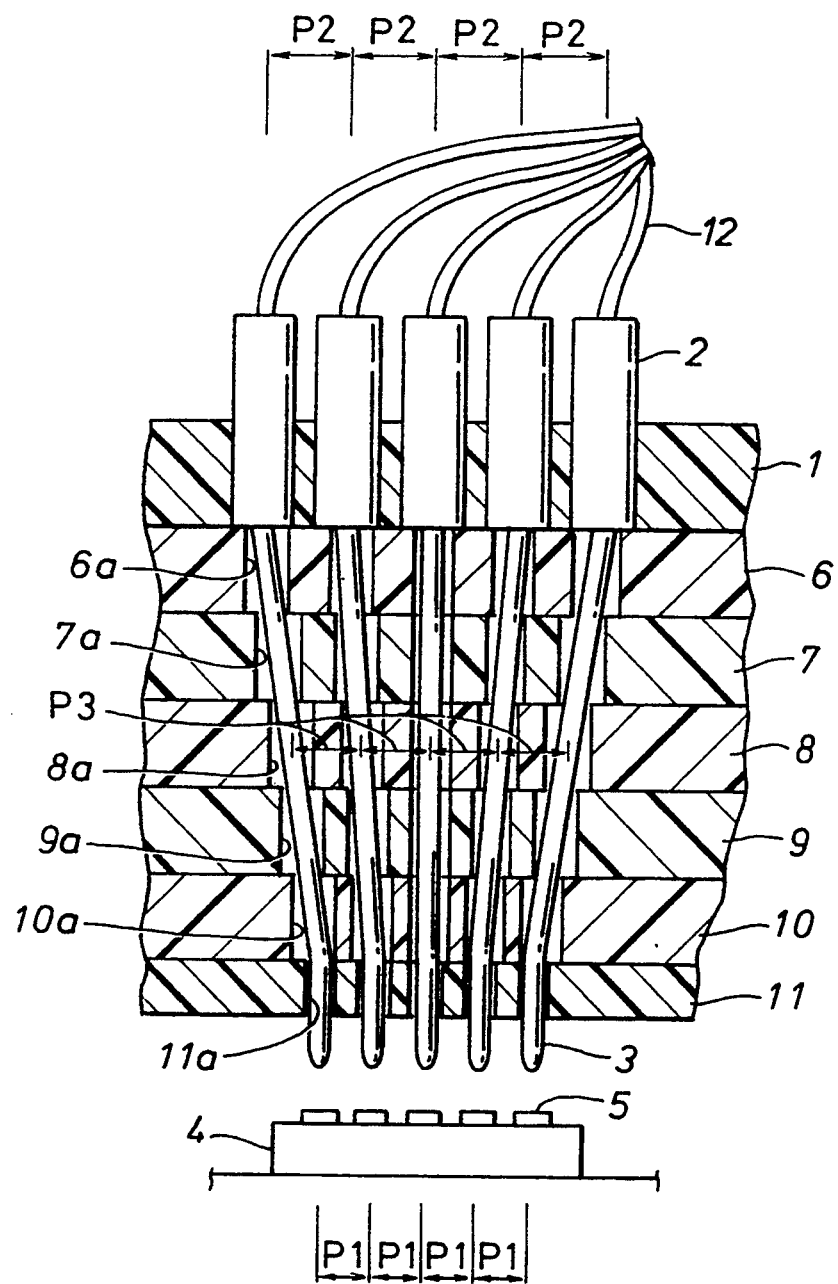
FIG. 1 is a sectional view showing a first embodiment of the contact probe unit for simultaneously accessing a plurality of points according to the present invention.

Referring to FIG. 1, tubular receptacles of a plurality of contact probes are passed through a receptacle holder 1 consisting of a plate member made of electrically insulating material such as synthetic resin in a mutually parallel relationship, and are fixedly secured thereto. The free end of each of the receptacles 2 is substantially flush with the lower surface of the receptacle holder 1, and the rear end of each of the receptacles 2 projects upward from the receptacle holder 1. The receptacles 2 are desired to be provided with as small a diameter as possible, and are preferably made of nickel silver which is suitable for precision working and provided with a high resistance to fatigue.

Each of the receptacles 2 slidably receives a base end of a needle member 3, and the free end of the needle member 3 projects from the free end or the lower end (as seen in FIG. 1) of the receptacle by a certain length. The tip of each of the needle members 3 is provided with a pointed shape so that the needle members 3 may contact the point to be accessed with an appropriate accuracy and pressure. Each of the receptacles 2 is internally and coaxially provided with a compression coil spring not shown in the drawing for urging the needle member 3 towards its free end in a conventional manner.

A plurality of intermediate guide plate members 6 through 10 each consisting of an electrically insulating plate member ere layered onto the lower surface of the receptacle holder 1, and a free end guide plate member 11 is layered onto the lower or the outer surface of the lowermost or the outermost intermediate guide plate member 10. The free end guide plate member 11 is provided with a plurality of guide holes 11a for guiding the free ends of the needle members 3 both in parallelism extending through the guide holes and in mutually substantially parallel relationship with each other.

When a plurality of points of a densely distributed electroconductive pattern 5 of a printed circuit board 4 are required to be tested, the free ends of the needle members 3 are required to be brought close to each other. To achieve this goal, the pitch P1 of the guide holes 11a of the free end guide plate member 11 is substantially smaller than the pitch P2 of the receptacles 2 mounted on the receptacle holder 1.

Each of the intermediate guide plate members 6 through 10 is provided with guide holes 6a through 10a, and the pitch of these guide holes (only the pitch P3 of the middle intermediate guide plate member 8 is shown in FIG. 1 as a representative pitch of all the intermediate guide plate members 6 through 10) so that the needle members 3 may be properly guided from the distribution at the receptacle holder 1 to the distribution at the free end guide plate member 11 so as to provide a lateral support to the needle members against the tendency to buckle and so as not to cause any excessive curvature to the needle members 3. As a matter of fact, the guide holes in the intermediate guide plate members 6 through 10 are gradually and progressively brought closer together from the uppermost intermediate guide plate member 6 to the lowermost intermediate guide plate member 10 so that the optimum lateral support of the needle members 3 may be achieved and the stress to the needle may be minimized as they undergo their individual axial movement and pushed against the points to be tested. The base end of each of the needle members 3 received in the rear end of the corresponding receptacle 2 is connected to a control unit not shown in the drawing by way of a lead wire 12.

According to the above described contact probe unit, during the manufacturing process or as a part of the maintenance work, each of the needle members can be relatively easily passed through the guide holes 6a through 10a of the intermediate guide plate members 6 through 10, and the guide hole 11a of the free end guide plate member 11. Further, since the curve of each needle member 3 can be accurately controlled, the positional accuracy of the tip of the needle member can be ensured, and the uniformity of the positions of the free ends of the needle members can be ensured. Further, the provision of the intermediate guide plate members 6 through 10 totally eliminates the possibility of the needle members touching each other when they are pushed against the points to be tested.

The guide action of the guide holes 6a through 10a of the intermediate guide plate members 6 through 10, and the guide holes 11a of the free end guide plate member 11 minimizes the stress acting upon each of the needle members and controls the tendency of the needle members to buckle, and this will significantly increase the durability of the receptacles as well as the needle members.

The guide holes can be formed by any of known hole forming techniques, such as mechanical drilling, water Jet drilling, and laser drilling, among other possibilities.

Figure 2:
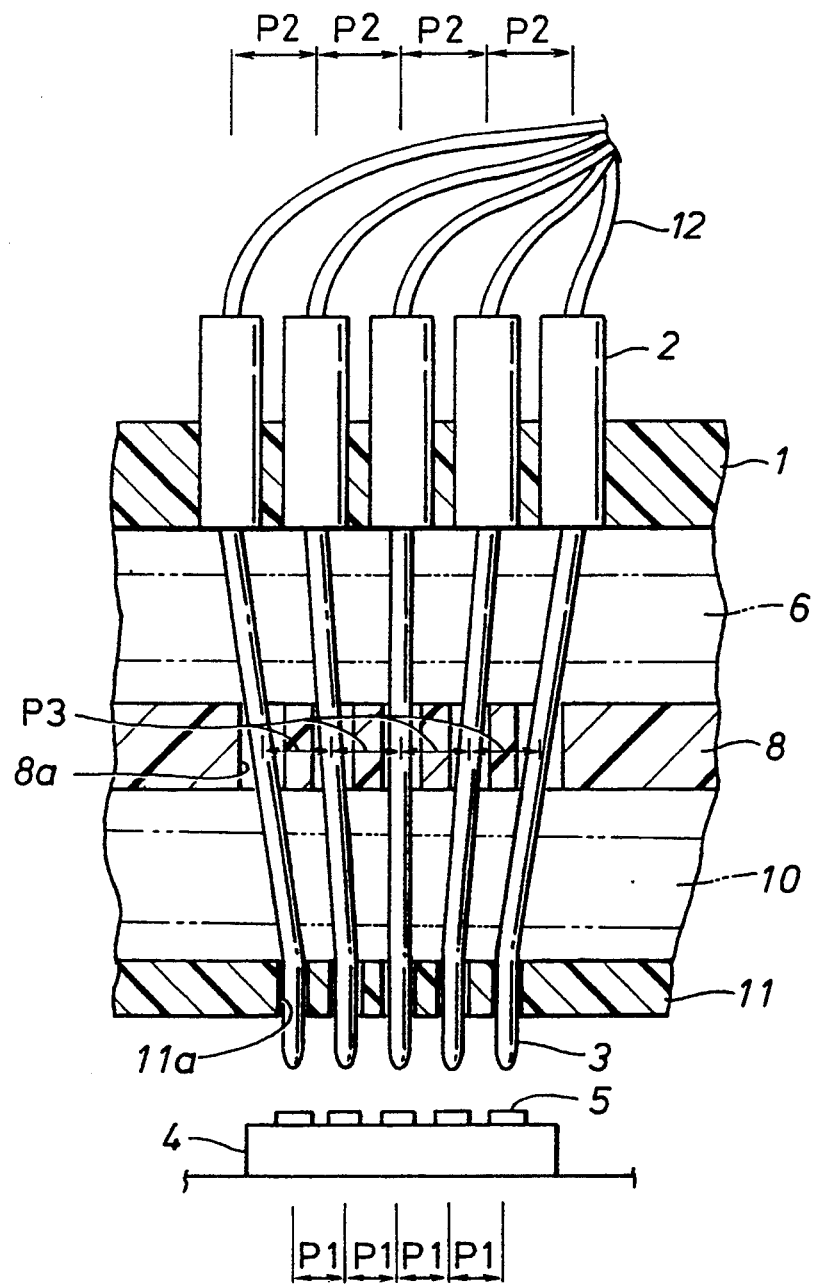
FIG. 2 is a view similar to FIG. 1 showing a second embodiment of the present invention.

FIG. 2 shows a second embodiment of the present invention. According to this embodiment, only one intermediate guide plate member 8 is provided between the receptacle holder 1 and the free end guide plate member 11, and there is a gap between the receptacle holder 1 and the intermediate guide plate member 8, and between the intermediate guide plate member 8 and the free end guide plate member 11 as opposed to the first embodiment in which the intermediate guide plate members 6 through 10 are interposed between the receptacle holder 21 end the free end guide plate member 11 without any gap between any adjoining two of the members. If necessary, additional intermediate guide plate members 6 and 10 may be provided as indicated by imaginary lines.

Figure 3:
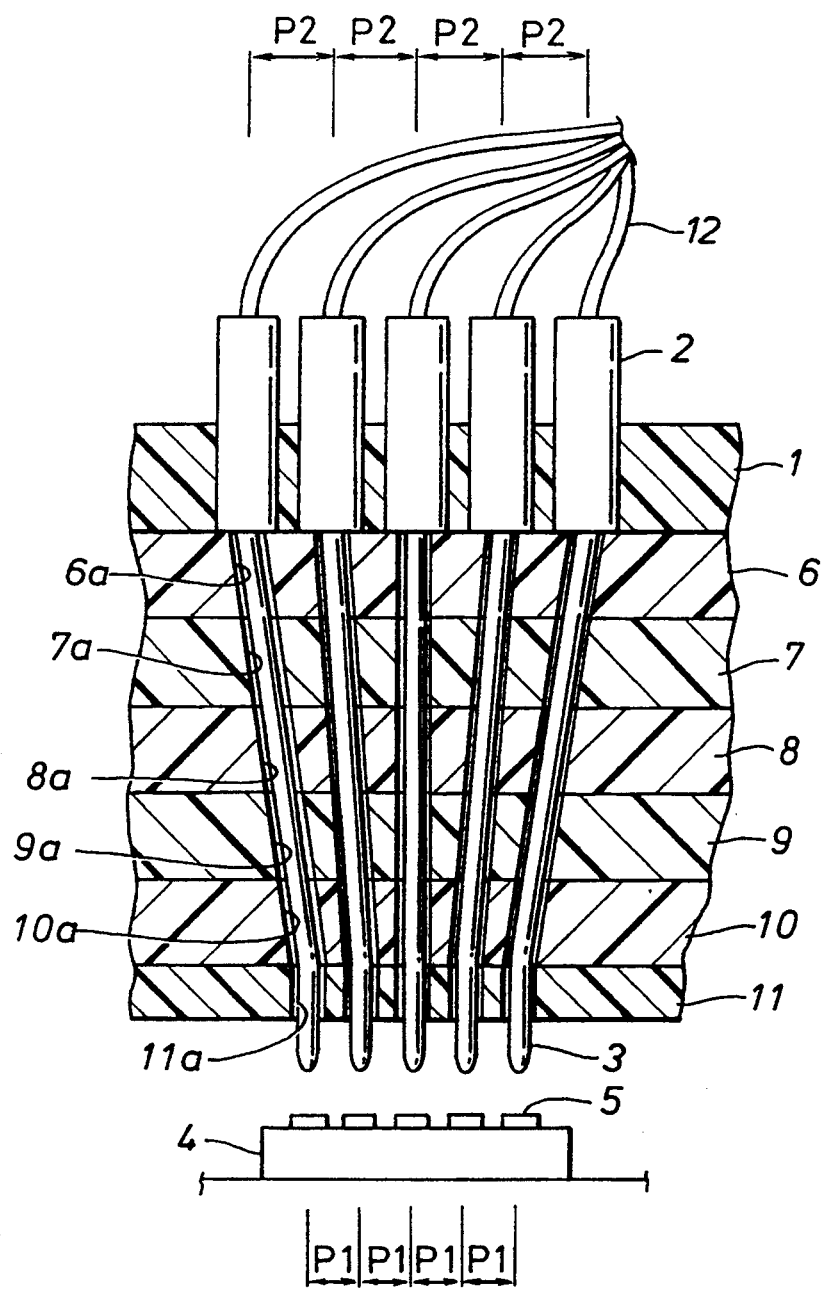
FIG. 3 is a view similar to FIG. 1 showing a third embodiment of the present invention.
Figure 4:
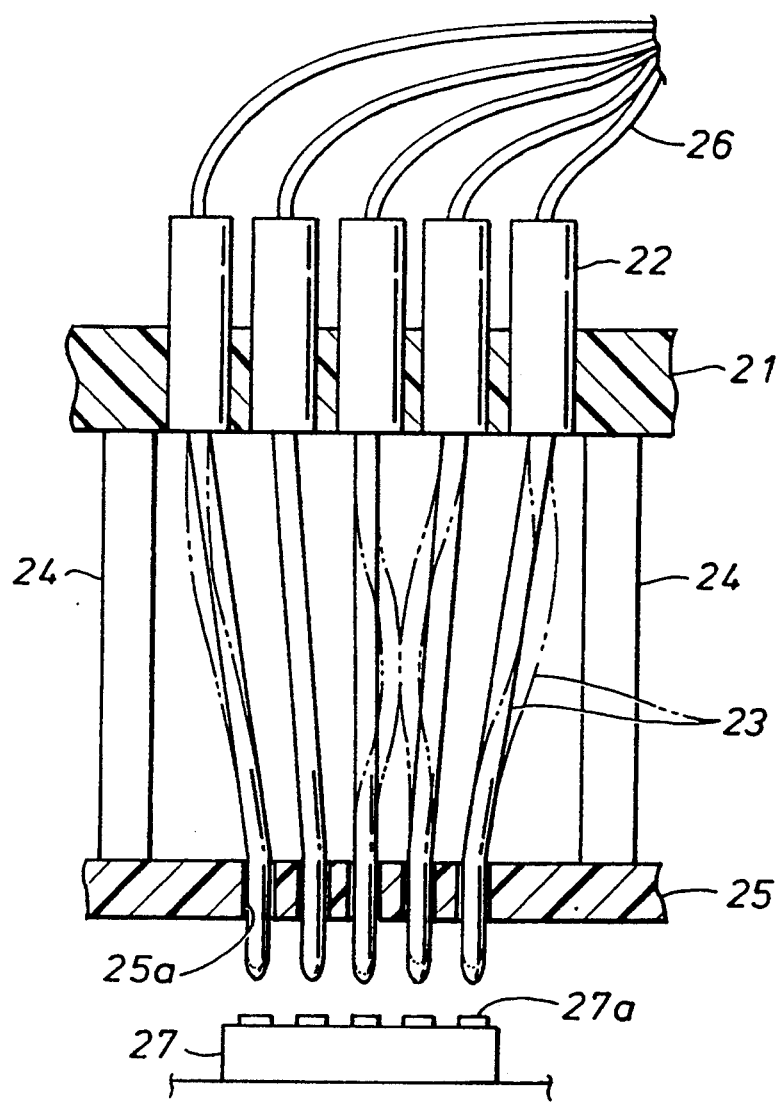
FIG. 4 is a view similar to FIG. 1 showing a conventional contact probe unit.

FIG. 3 shows a third embodiment of the present invention. In this embodiment, the guide holes 8a through 10a of the intermediate guide plate members 8 through 10 are slanted so as to conform to the inclination of the needle member passed through the guide hole in question. By thus slanting the guide holes, the guide action of the guide holes can be even further improved.

Although the present invention has been described in terms of specific embodiments thereof, it is possible to modify and alter details thereof without departing from the spirit of the present invention.

What we claim is:

1. A contact probe unit, comprising:
   a receptacle holder member;
   a plurality of contact probes fixedly secured to said receptacle holder member in mutually substantially parallel relationship, each of said contact probes comprising a tubular receptacle having a free end and a base end, a needle member slidably received in each receptacle, and spring means urging each needle member so as to project a free end of each needle member from said free end of each receptacle, each of said tubular receptacles being parallel to each other;
   a free end guide member fixedly secured to said receptacle holder member in a spaced relationship relative to said receptacle holder member, and provided with a plurality of guide holes in mutually substantially parallel relationship for slidably receiving said needle members, the density of said guide holes of said free end guide member being higher than the density with which said contact probes are secured to said receptacle holder member and wherein said needle free ends extend in parallelism through said guide holes;
   intermediate guide members disposed between said free end guide member and said receptacle holder member so as to allow an axial movement to said needle members and provide a lateral support to said needle members; and
   wherein the free ends of said needle members are in mutually substantially parallel relationships with each other.

2. A contact probe unit according to claim 1, wherein said intermediate guide means comprises at least one intermediate guide plate member provided with a plurality of guide holes each slidably receiving an intermediate part of a corresponding one of said needle members, the density of said guide holes of said intermediate guide plate member being intermediate between the density of said guide holes of said free end guide member and the density with which said contact probes are secured to said receptacle holder member so that said needle members may be guided for axial movement without involving excessive curvature.

3. A contact probe unit according to claim 2, wherein said guide holes of said at least one intermediate guide plate member being slanted so as to substantially conform to the corresponding inclination of the needle members passed therethrough.

4. A contact probe unit according to claim 1, wherein said intermediate guide means comprises a plurality of guide plate members layered between said free end guide member and said receptacle holder member substantially without any gap therebetween and each provided with a plurality of guide holes each slidably receiving an intermediate part of a corresponding one of said needle members, the density of said guide holes of said intermediate guide plate members being progressively increased from the guide plate member adjacent said receptacle holder member to the guide plate member adjacent said free end guide member so that said needle members may be guided for axial movement without involving excessive curvature.

5. A Contact probe unit according to claim 4, wherein said guide holes of said intermediate guide plate members being slanted so as to substantially conform to the corresponding inclination of the needle members passed therethrough.

* * * * *